United States Patent
Bellido-Gonzalez

(10) Patent No.: US 9,028,660 B2
(45) Date of Patent: May 12, 2015

(54) LOW IMPEDANCE PLASMA

(75) Inventor: Victor Bellido-Gonzalez, Liverpool (GB)

(73) Assignee: Gencoa Ltd, Merseyside (GB)

( * ) Notice: Subject to any disclaimer, the term of this patent is extended or adjusted under 35 U.S.C. 154(b) by 26 days.

(21) Appl. No.: 12/673,393

(22) PCT Filed: Aug. 14, 2008

(86) PCT No.: PCT/GB2008/050709
§ 371 (c)(1),
(2), (4) Date: Feb. 17, 2011

(87) PCT Pub. No.: WO2009/022184
PCT Pub. Date: Feb. 19, 2009

(65) Prior Publication Data
US 2011/0127157 A1    Jun. 2, 2011

(51) Int. Cl.
C23C 14/35        (2006.01)
H01J 37/34        (2006.01)

(52) U.S. Cl.
CPC ......... H01J 37/3405 (2013.01); H01J 37/3452 (2013.01)

(58) Field of Classification Search
USPC .............. 204/298.26, 298.21, 298.22, 192.12
See application file for complete search history.

(56) References Cited

U.S. PATENT DOCUMENTS

| | | | | |
|---|---|---|---|---|
| 4,963,239 | A | * | 10/1990 | Shimamura et al. ..... 204/192.12 |
| 5,047,131 | A | * | 9/1991 | Wolfe et al. ............. 204/192.23 |
| 5,364,518 | A | * | 11/1994 | Hartig et al. ............ 204/298.22 |
| 5,616,225 | A | * | 4/1997 | Sieck et al. ............. 204/298.14 |
| 5,814,195 | A | * | 9/1998 | Lehan et al. ............ 204/192.12 |
| 6,365,010 | B1 | * | 4/2002 | Hollars .................... 204/192.12 |
| 6,440,282 | B1 | * | 8/2002 | Wada et al. ............... 204/298.2 |
| 2001/0009221 | A1 | * | 7/2001 | Anzaki et al. ........... 204/192.12 |
| 2005/0109616 | A1 | | 5/2005 | Ohta et al. |
| 2005/0145488 | A1 | | 7/2005 | Erbkamm et al. |
| 2005/0199485 | A1 | | 9/2005 | Kadlec et al. |
| 2006/0000705 | A1 | * | 1/2006 | Hartig et al. ............. 204/192.12 |

FOREIGN PATENT DOCUMENTS

| | | |
|---|---|---|
| DE | 19610253 A1 | 10/1997 |
| DE | 10145201 C1 | 11/2002 |
| WO | 9201081 A1 | 1/1992 |
| WO | 9634124 A1 | 10/1996 |

\* cited by examiner

*Primary Examiner* — Jason M Berman
(74) *Attorney, Agent, or Firm* — LeonardPatel PC

(57) ABSTRACT

A magnetron sputtering apparatus (100) comprising: a magnetic array arranged to create a magnetic field (103) in the vicinity of a tubular target (2) which target at least partially surrounds the magnetic array and acts as a cathode (2a); an anode (2b); the magnetic array being arranged to create an asymmetric plasma distribution with respect to the normal angle of incidence to a substrate (3); and means (1b) for enhancing the magnetic field to produce a relatively low impedance path for electrons flowing from the cathode (2a) to the anode (2b).

23 Claims, 7 Drawing Sheets

SYMMETRIC ARRAYS

ASYMMETRIC ARRAYS

LOW IMPEDANCE PLASMA

This invention relates to magnetron sputtering and in particular, but without limitation, to magnetron sputtering using a low-impedance plasma.

Embodiments of the invention may involve the use of low impedance AC dual cylindrical magnetron sputtering plasma discharges with or without rotating targets, the use of such devices and control during non-reactive and reactive processes, with or without feedback plasma process control, and non-AC sputtering applications such as RF, DC and DC pulsed.

There is an area of the industrial vacuum coating and treatment technology that is currently based on sputtering of substrates that can not be biased, such as glass or plastic components. Some of the current coatings of interest are deposited by Dual Magnetron Sputtering (DMS) in order to avoid the "disappearing anode" effect.

For example, in the BOC Group Inc.'s application No: WO 96/34124, DMS two magnetron sputtering sources (plasma devices) continuously alternate electrical polarity so that while one is biased negatively (becoming a sputtering cathode) the other one is biased positively (becoming an anode) and vice versa. The typical voltage and current variations is a type of Alternating Current (AC) mode. This process operation is described as Dual Magnetron Sputtering in AC (DMS-AC) operation or simply DMS. In this way, since the same source goes through a cycle of sputtering before becoming an anode, the anode surface can become a clean conductive surface.

In many of the current applications, the target has a cylindrical geometry. The target is generally rotating around the central cylindrical axis, which encourages a relatively low impedance path for electrons travelling through the plasma. During DMS-AC operation the stability of the discharge has many influences. Normally DMS is used in inline continuous production where the substrate is coated as it passes through the plasma/deposition region. The AC power supply would need to respond in order to maintain the process set points. If the plasma suddenly disappears then a fast re-ignition is necessary or the moving substrate would be susceptible to defective coating conditions. In order for that re-ignition to occur the plasma ignition impedance has to be suitably low. Known solutions must operate in conditions that allow the discharge to be maintained and reignited. Generally that would imply limitations on any one or more of the following: distance between the two sources; distance between the sources and the substrates to be coated or treated; minimum gas pressure required for the coating and re-ignition operations; and maximum magnetic field strength.

One of the effects of AC operation on DMS is that the transport of electrons between the two sources creates ionisation that could benefit the process. In the known systems, the current in the present situation is very diffuse and most of the electrons are not being directed towards the main clean areas which would provide the best anode surfaces. This can create micro-arcing which can be responsible for defects in coating quality. Furthermore the magnetic interactions between the two sources can tend to bring some separation between the main coating flux and the ion flux which affects the coating properties The present invention exploits the use of asymmetric magnetron sputtering; see for example Gencoa Ltd's United Kingdom patent application number 9821496.8, in which the magnetic fields of each individual device have been constructed in a asymmetric way, constituting an asymmetric magnetic array, providing a change of direction of plasma flux with respect to a standard magnetron device.

Objects of the present invention include: improving the operation and performance of DMS, for example by presenting a low plasma impedance discharge; concentrating the electron transport in to a narrower volume to improve the ionisation effectiveness of the DMS operation; channeling electrons towards an effective electrically clean anode and/or enhancing coating properties, such as coating density.

According to a first aspect of the invention there is provided a magnetron sputtering apparatus comprising: a magnetic array arranged to create a magnetic field in the vicinity of a tubular target which target at least partially surrounds the magnetic array and acts as a cathode; an anode; the magnetic array being arranged to create an asymmetric plasma distribution with respect to the normal angle of incidence to a substrate; and means for enhancing the magnetic field to produce a relatively low impedance path for electrons flowing from the cathode to the anode.

Possible advantages flowing from the invention include: the ability to use stronger magnetic fields; as the plasma ignition impedance is lower, being able to provide a high ion flux density operation; and providing a stable, low impedance discharge for single magnetron sputtering with magnetically guided active or passive anode.

The means for enhancing the magnetic field may also comprise a magnetic array arranged to create a magnetic field in the vicinity of a second tubular target.

Power means may be connected to the target and anode, which power means is capable of creating and maintaining a plasma comprising material removed from the target, which power means may be capable of creating and maintaining a plasma comprising material removed from the target is connected to both targets. A separate power means is connected to each target. Both targets may be connected to a common power means. The power means, where provided, may apply an alternating current, direct current, pulsed current, radio frequency and/or HIPIMS to one or both targets. The power means, where provided, may be connected to both targets and the polarity alternated such that each target alternates between being an anode and a cathode.

The means for enhancing may comprise one of the magnetic arrays being an asymmetric magnetic array.

The arrangement of the asymmetric magnet arrays can produce a non-uniform/distorted magnetic field distribution comprising one or more:
1) zones of relatively high impedance, which can act as plasma traps thereby confining some of the plasma responsible for sputtering against the target surface; and
2) zones of relatively low impedance, which can act as a low impedance pathway, or an electron channel, for electron transfer from the cathode to the anode.

By providing a magnetic field distribution comprising zones of relatively high and relatively low impedance, the overall magnetic field can be such as to enhance the sputtering effect and/or to encourage electrons to flow relatively uninhibited from the cathode, via the substrate surface, to the anode.

Known magnetron sputtering apparatuses do not provide such a magnetic field distribution, since no low-impedance pathway for the electrons is provided. In a known magnetron sputtering apparatus, the electrons must pass through a zone having a relatively high impedance. However, the present invention can provide, for the same/comparable materials and process conditions, an electron channel having an impedance between 5% and 50% lower than a known magnetron sputtering apparatus.

The or each asymmetric array may comprise one or more magnets mounted on a mounting plate, asymmetry in the magnetic field being achieved by any one or more of the group comprising: the position of the magnets being located asymmetrically about an axis of the magnetic array; the magnets being of unequal sizes or strengths; the presence of ferromagnetic or non-ferromagnetic materials which break the symmetry of the interaction between two or more of the magnets; and the asymmetric shape of the mounting plate.

The asymmetric magnetic array may comprise a central magnet and a pair of outer magnets located on opposite sides of, and spaced-apart from, the central magnet. The asymmetric array may comprise a central row of magnets and a pair of rows of magnets located on opposite sides of, and spaced apart from, the central magnet row.

The mounting plate may comprise a ferromagnetic plate and/or other ferromagnetic components.

The or each asymmetric magnetic array may produce a magnetic field distribution comprising one or more plasma traps adapted to confine a portion of the plasma against the surface of the target.

At least one plasma trap may be located immediately adjacent at least one magnetic field channel, and/or be interposed between a pair of magnetic field channels.

The or each tubular target may be rotatable, e.g. about its longitudinal axis. Rotation can be in any direction, continuous or intermittent and/or reversible.

Any of the magnetic means may be moveable in use.

The plasma trap or traps may be arranged to sputter clean the surface of the target. The tubular target may be continuously rotatable so that a sputter-cleaned portion thereof is continuously moved into the vicinity of the magnetic field channel to provide an ideal conditioned anode/cathode surface.

Means may be provided for providing a controlled atmosphere in the vicinity of the target and substrate, which controlled atmosphere may comprise a partial vacuum.

The controlled atmosphere may comprise total pressure of less than 1 mbar, and/or an inert gas (e.g. argon), and/or a reactive gas (e.g. hydrocarbon, organometallic, metal inorganic complex, oxygen, nitrogen and/or water vapour).

An anode cover may be provided.

The magnetic arrays may be: substantially the same and are arranged asymmetrically about a major axis of the dual magnetron sputtering device; different and are arranged symmetrically about a major axis of the dual magnetron sputtering device; are different and are arranged asymmetrically about a major axis of the dual magnetron sputtering device; and/or substantially the same and are arranged symmetrically about a major axis of the dual magnetron sputtering device.

Means for electrically biasing the substrate with respect to the target and/or ground may optionally be provided, which means may apply a direct current, an alternating current, a pulsed current and a radio frequency bias, to the substrate.

The asymmetric axis of the or each magnetic array is non-orthogonal to the surface of the substrate.

The magnetron sputtering apparatus may comprise part of vacuum deposition system, a glass coating equipment system, a web coating deposition system.

A second aspect of the invention provides a magnetron sputtering process carried out using an apparatus as described herein. The process may be for magnetron sputtering a plastic, glass, ceramic, metal or semiconductor substrate.

A third aspect of the invention provides a coating formed by, or a treatment resulting from, the process or apparatus as described herein.

According to a fourth aspect of the present invention a very low impedance AC dual cylindrical magnetron sputtering plasma device is provided.

The invention could use rotating or static targets. Magnetic arrays could also be static or movable. Magnetic array movement could also be in any direction with simple or complex combinations of linear, reciprocated or oscillatory nature. Magnetic array movement could also be of a scanning nature.

This invention may also relate to the use of such devices and control during non-reactive and reactive processes, with or without feedback plasma process control. This invention also relates to non AC sputtering applications such as RF, DC, DC pulsed power, complex power wave forms or high intensity pulsed power, such as HIPIMS (High Power Impulse Magnetron Sputtering) technology for single or plurality of plasma sources.

The present invention may also provide magnetic field plasma channeling mainly, but not exclusively, across two plasma devices. This channel of plasma could be varied in position with respect to the substrate.

In the present invention the asymmetric magnetic arrays may be designed and operated in a dual cylindrical target. When using AC power between the two individual sources the impedance of the discharge can be lowered significantly with respect to a standard configuration. Also the distance target to the substrate can be reduced and the plasma density and source efficiency improved with respect to a standard DMS operation. Furthermore when the targets rotate the way in which the electrons are guided by the fields would mean that they are channeled towards a very clean highly conductive surface, unlike in standard DMS where the electrons find those clean areas difficult to reach, hence the increased impedance and less plasma confinement. Furthermore, the higher plasma confinement of the present invention helps to reduce and/or can prevent contamination of the coating by other elements from the deposition surroundings. In addition, the plasma interaction with substrate could be controlled in order to control specific coating deposition requirements, e.g. ion bombardment per deposited atom.

The present invention can also relate to the use of these devices in both reactive and non-reactive environments, for example, deposition of SiOx from Si targets by sputtering in Ar and O2 atmosphere. In reactive sputtering, the higher plasma density of the invention can provide enhanced reactivity of the plasma species resulting in a more stable, dense coating.

The present invention may also relate to the speed of rotation of the cylindrical target, from zero (static) to any rotational speed whether it is constant, complex or variable.

The present invention may also relate to the use of these devices in power modes different to AC. The magnetic plasma confinement of the present invention may improve properties in operation modes, stability and coating quality by selectively channeling the ion flux relative to the coating flux and also by preventing damage due to parasitic currents appearing on the coating or return currents travelling through the coating. These phenomena can produce non-uniformity and coating quality damage. The present invention, by guiding the plasma charge, can improve the coating product operation and final quality.

The present invention may relate to unbalanced and/or balanced magnetic arrays.

The magnetic polarity could be the same or opposite between adjacent sources and devices.

The present invention may also relate to arrays tilted or in an angle with respect to the substrate movement different from parallel or perpendicular.

The present invention may also relate to arrays with circular or linear oscillatory motion or a combination.

The present invention may also relate to simple or multiple race tracks on a single cathode.

The present invention may also relate to single sources used with a passive or active anode. The anode effect may be enhanced by magnetic guiding. The anode may or may not be sputtered. The anode could be of hidden or non-hidden construction. The anode could be independently biased from ground potential.

The present invention may also relate to substrates that may or may not be biased.

The present invention may relate to any magnetron sputtering application such as web, glass, display, decorative and batch coaters.

The invention will be further described by way of example only with reference to the following figures in which.

Figure 1:
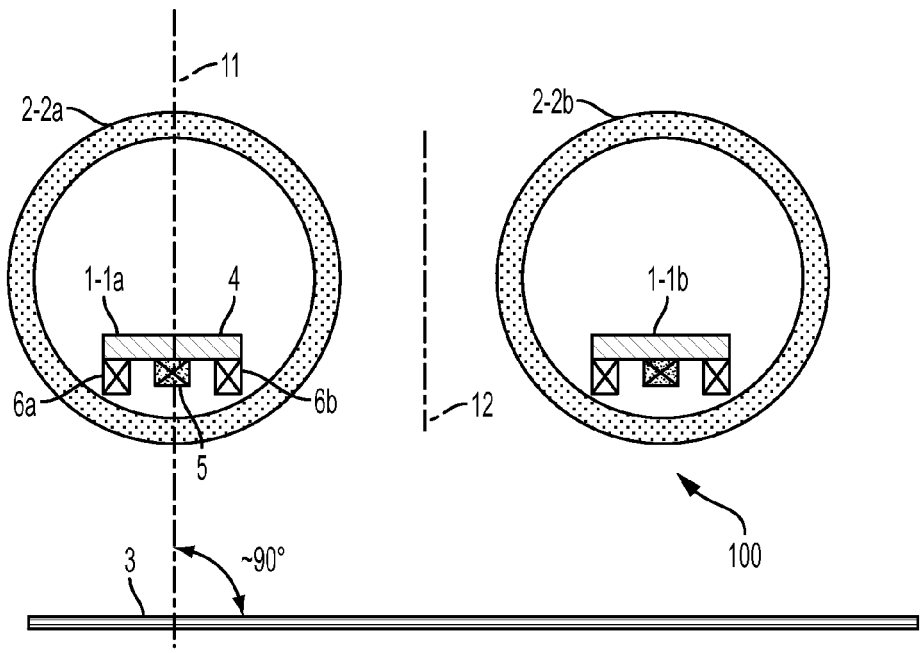
FIG. 1 is a schematic cross-section of a prior art dual cylindrical magnetron sputtering device.

In FIG. 1, a magnetron sputtering device 100 comprises a generally planar substrate 3 that is arranged to move linearly beneath a pair of cylindrical targets 2a, 2b. Each target 2a, 2b encloses a magnet array, which forms a magnetic field in the vicinity of the targets 2a, 2b and substrate 3. Each magnet array comprises a generally planar support 4 onto which magnets 6 of various sizes, shapes and strengths are be affixed. The strength and distribution of the magnetic field that forms can be controlled by the appropriate selection of magnet types, polarities, strengths and/or geometries.

The magnet arrays and targets are arranged in a spaced-apart manner with their longitudinal axes parallel. Each magnet array is symmetrical about a minor axis of symmetry 11, which axis is perpendicular to the substrate surface 3. Furthermore, the magnet arrays are arranged symmetrically about a major axis of symmetry 12, which is also perpendicular to the plane of the substrate 3.

A typical (magnet) array comprises of a mainly central magnet row of magnets 5 surrounded by outer magnetic rows of magnets 6a and 6. Axis 11 is generally perpendicular to substrate movement and/or position 3. Substrate 3 receives coating material which is being sputtered from cylindrical targets 2 (2a-2b) either in reactive or non-reactive mode. Also the device could be used as a plasma treater in which substrate 3 receives a plasma treatment but not necessarily depositing coating.

Figure 2:
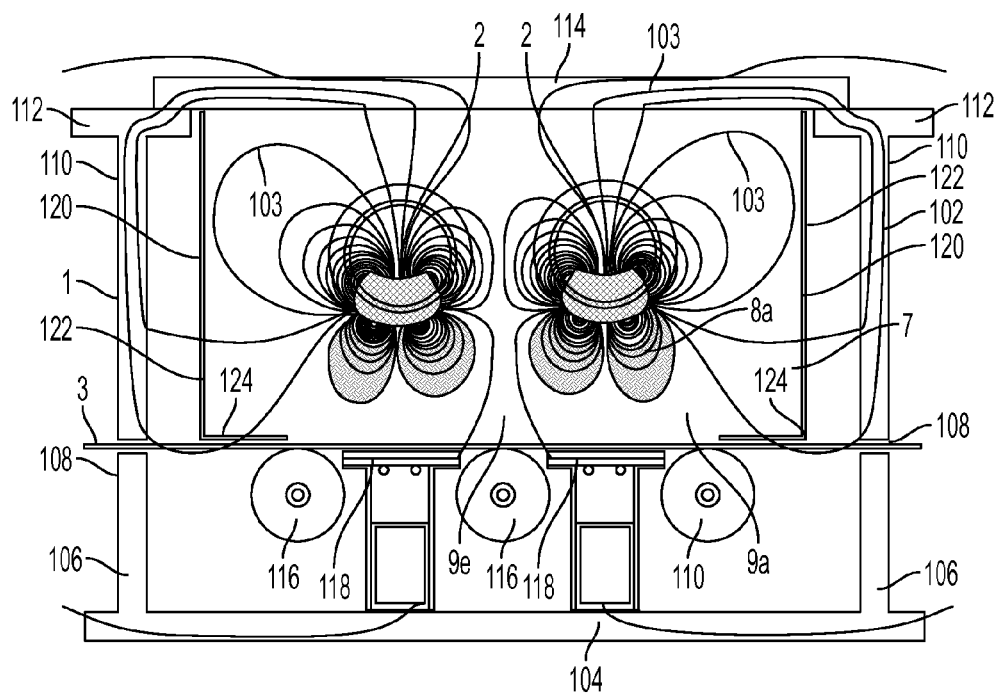
FIG. 2 is a schematic diagram showing the magnetic field for the dual cylindrical magnetron of FIG. 1.

FIG. 2 shows, schematically, the magnetic field distribution using field lines 103 at points along which the magnetic field strength is of a particular value. The magnetron sputtering device 100 comprises a housing 102 having a planar base plate 104 upwardly from which side walls 106 extend. An opening 108 is provided in two of the side walls 106 through which the substrate 3 can be fed. Upper edges 110 of the side walls 106 terminate in t-section flanges 112 to which a planar upper wall 114 is sealingly affixed. The base wall 104, side walls 106 and upper wall 114 are all ferromagnetic and thus provide path for the magnetic field, as is shown by some of the field lines 103 being within the walls.

The substrate 3 is supported from below by rollers 116 and brushes 118, which brushes 118 can also be used to bias the substrate 3.

Also shown in within the chamber 102 is a generally I-section internal wall 120 comprising a generally vertical planar side wall portion 122 and an inwardly folded base wall portion 124 extending from, and at right angles to, the lower edge of the side wall portion. The underside of the base wall portion 124 is parallel to, and spaced apart from, upper surface of the substrate 3.

In FIG. 2, magnetic field lines would define the plasma zones. Typically the cylindrical magnetrons are placed in a low pressure atmosphere 7. The main plasma zones 8a near each target 2 are responsible for the magnetron sputtering effect. Typically the substrate to be treated travels continuously in an in-line process which enables it to be exposed to a plasma flux area 9a. Excessive exposure to the plasma flux could damage or alter properties. In typical situations, such as when substrate 3 is glass or a plastic web, non uniformity and substrate damage would limit the maximum operating power of the device. The arrangement of the device produces anomalous plasma regions such as 9e which typically result in a high impedance barrier.

Figure 3:
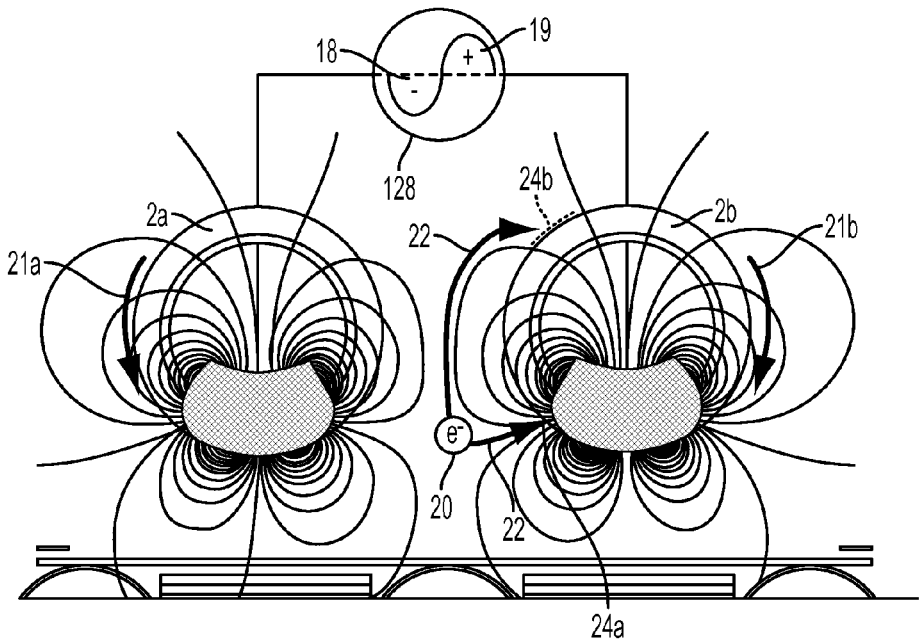
FIG. 3 is a schematic diagram showing a power mode and electron transfer for the dual magnetron sputtering device of FIG. 2.

FIG. 3 is a close-up of the magnetron sputtering apparatus 100 of FIG. 2 and shows, schematically, how the targets 2a, 2b are connected to an alternating current power supply 128. The electrical polarities of targets 2a and 2b therefore alternate.

In FIG. 3, while target 2a, at a particular time of the cycle, is mainly biased negatively 18, the target 2b would be biased positively 19. In this way source 2a emits electrons 20 which travel towards the anodic surface on target 2b. Due to the magnetic field forming a shield for the current to cross, the electrons 20 will be directed mainly towards specific surfaces of 2b. These surfaces would be near the magnetron plasma trap 24a and far from the magnetron plasma trap 24b. In ideal conditions anodic surfaces need to be clean in order to receive the current. For this reason, the best rotation configuration will be unique and described by 21a and 21b. State of the art has no awareness of this situation. When the rotation is not as described in this figure then arcing on target materials would occur which would induce defects on coating surfaces 3.

FIG. 4 depicts, schematically, various known magnet arrays. In each case, a row of central magnets 5 is flanked by two rows of outer magnets 6, all magnets 5, 6 being affixed to the surface of a generally planar support 4.

Figure 4C:
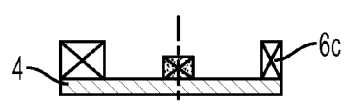
FIG. 4 is a series of schematic cross-sections of known magnetic arrays.
Figure 4A:
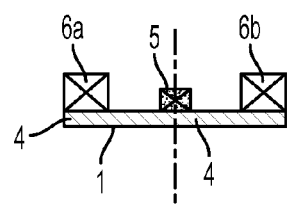
Figure 4D:
Figure 4E:
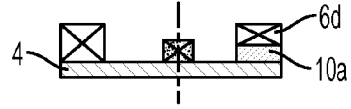
Figure 4F:
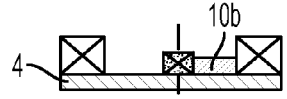
Figure 4B:
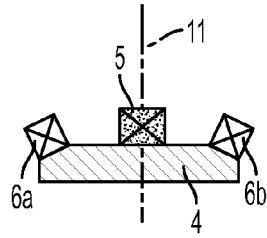
Figure 4G:
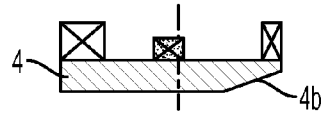

FIGS. 4a and 4b are known symmetric magnetic arrays in which a central magnet 5 is approximately centred on a minor axis of symmetry 11. The outer magnets 6a and 6b are also of such a nature, geometry and position that are fundamentally the same about the same minor axis of symmetry 11. Generally, although not exclusively, magnets are mounted on a ferromagnetic plate 4 which could vary in material and geometry.

FIGS. 4c, 4d, 4e, 4f and 4g depict different configurations of asymmetric arrays. In an asymmetric array, the minor axis 11 is no longer an axis of symmetry. Asymmetry could be achieved by different means such as having the position of central magnet 5 off-centre such as in FIG. 4c and in FIG. 4g. Asymmetry, such as shown in FIG. 4d could be achieved by different size magnets 6c on the outer magnetic row compared to the other side 6a. Asymmetry, such as shown in FIG. 4e could be achieved by the introduction of ferromagnetic and/or non-ferromagnetic materials 10a interposed between the central 5 and outer magnets 6 (e.g. FIG. 4f) or interposed between the outer magnet 6 and the substrate 4 (e.g. FIG. 4e). Asymmetry could even be achieved, such as in FIG. 4f, with a fundamentally symmetric magnet arrangement but by introducing some ferromagnetic elements 10b which break the symmetry of the interaction between the central magnet 5 and one or both of the outer magnetic rows 6a and 6b. Also, as in FIG. 4g, asymmetry could be achieved by a different geometrical design of the ferromagnetic support plate 4b. Asymmetric arrays could be achieved, although not exclusively, by any combination of the above.

Figure 5:
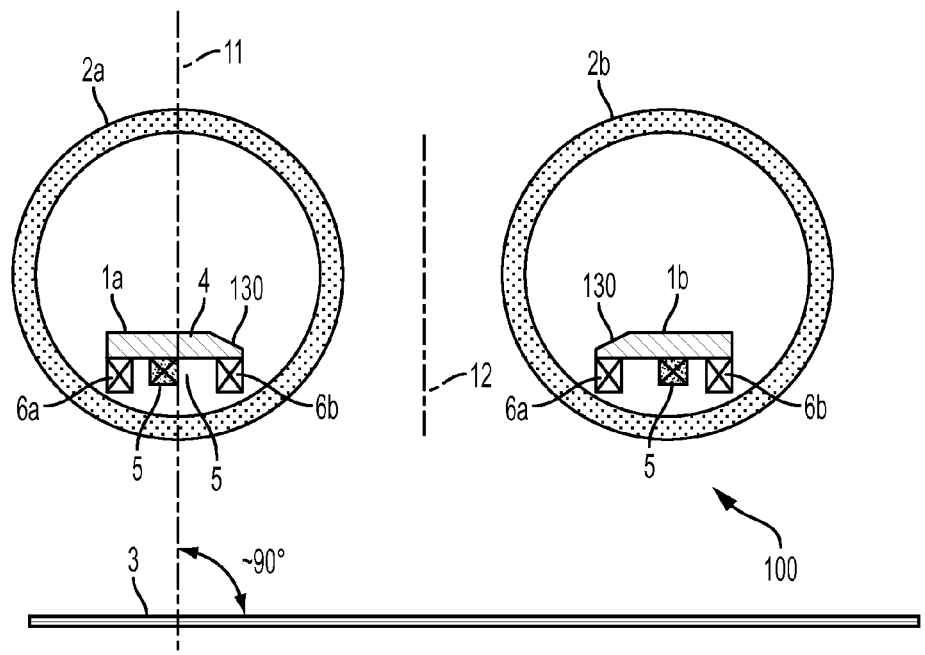
FIG. 5 is a schematic cross-section of a dual cylindrical magnetron sputtering device according to the invention.

FIG. 5 is similar to FIG. 1 and identical reference numerals are used to identify identical features in the respective drawings. The difference between the arrangement shown in FIG. 1 and that of FIG. 5 is that in FIG. 5, the magnetic arrays 1 are asymmetric and hence minor axis 11 is no longer an axis of symmetry. In particular, the support plates 4 of each magnetic array each comprise a chamfered edge 130 and the central magnet 5 of each magnetic array is mounted off-centre with respect to the outer magnets 6a, 6b. It will be noted that the chamfered edge 130 is on the opposite side of the minor axis 11 to the offset central magnet 5. The magnetic arrays are, however, symmetric with respect to the major axis 12, which is an axis of symmetry for targets 2.

Figure 6:
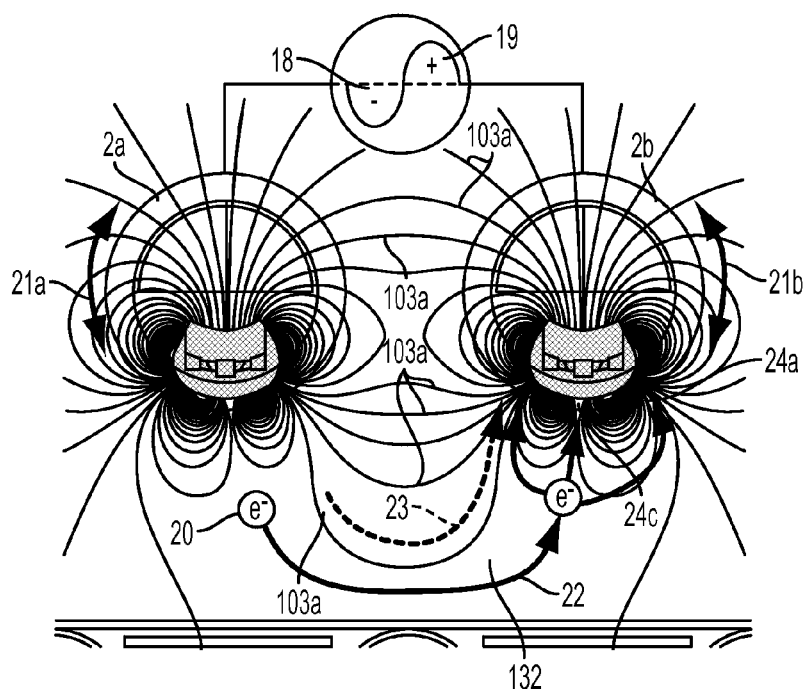
FIG. 6 is a schematic diagram showing the magnetic field, power mode and electron transfer for the dual cylindrical magnetron of FIG. 5.

FIG. 6 is similar to FIG. 3 and identical reference numerals are used to identify identical features in the respective drawings. The difference between the arrangement shown in FIG. 6 and that of FIG. 3 is that the magnetic arrays are not symmetrical about minor axis 11. The main effects of providing asymmetric magnetic arrays is that the magnetic field lines 103 are distorted when compared to the filed lines 103 of FIGS. 2 and 3. Specifically, rather than the field lines 103 are, overall, rotated towards the major axis 12, which means that instead of looping around a single magnetic array, some of the field lines 103a extend between the magnetic arrays. This, effectively, forms a "field channel" 132 and a barrier 23 which guide electrons along a low impedance path from the cathode to the anode.

In FIG. 6, while target 2a is mainly biased negatively 18, the target 2b would be biased positively 19. In this way source 2a emits electrons 20 which travel 22 towards the anodic surface on target 2b. Due to the magnetic field channel forming the electrons 20 will be easily directed mainly towards specific surfaces of 24a and 24c. The magnetic field forms a barrier 23 which limits the escape of electrons outside the channel. All these surfaces would be near the magnetron plasma trap which is an ideal conditioned anodic surface as it gets sputtered clean during the sputtering cycle. This asymmetric array enables rotation 21a, 21b of targets 2a and 2b in any direction without affecting the coating properties on the substrate.

Figure 7:
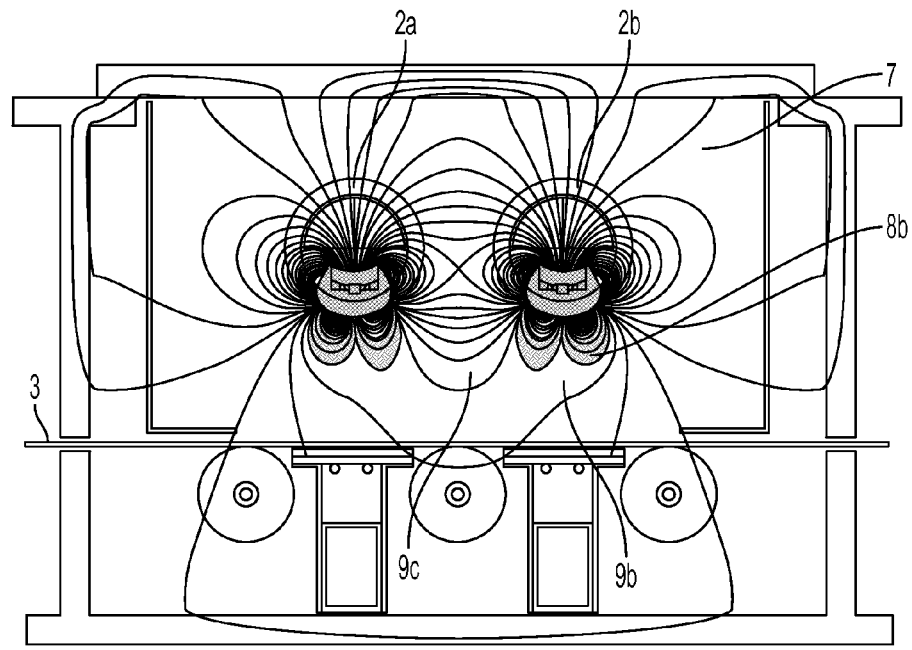
FIG. 7 is a schematic diagram showing a magnetic field for the dual magnetron sputtering device of FIG. 5.

The arrangement shown in FIG. 7 is substantially the same as that shown in FIG. 6 and the magnetic field lines 103 define the plasma zones. Typically the cylindrical magnetrons are placed in a low pressure atmosphere 7. The main plasma zones 8b near each target 2 responsible for the sputtering effect are not symmetric with respect to the individual magnetron (or the minor axis 11). Typically, the substrate to be treated 3 travels continuously in an in-line process which enables it to be exposed to a plasma flux area 9b which is channeled from target 2a to 2b and vice versa.

Figure 8:
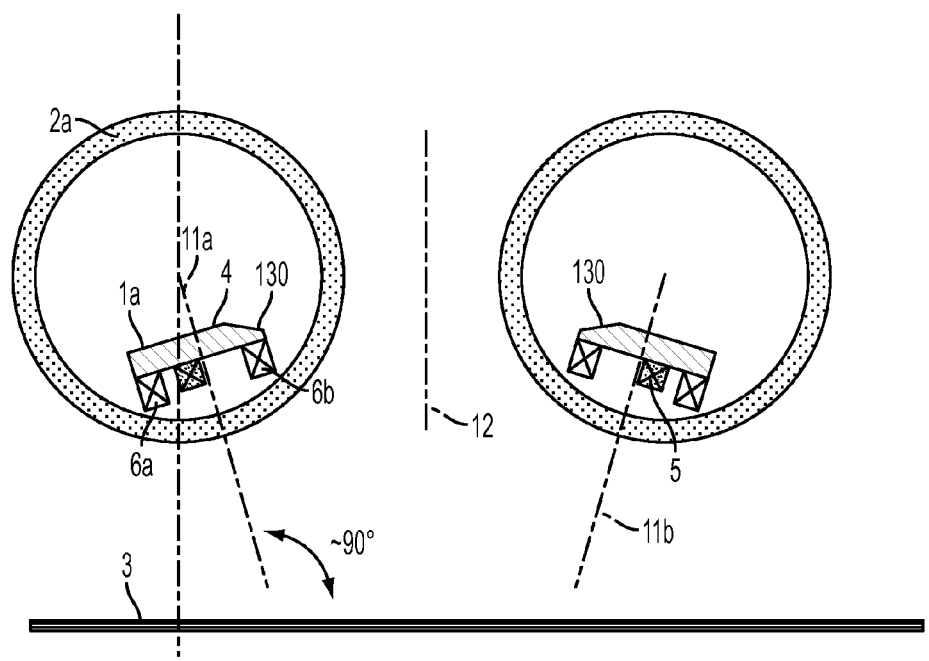
FIG. 8 is a schematic cross-section of a first variant of the asymmetric dual cylindrical magnetron of FIG. 5.

In the case shown in FIG. 8, which is similar to the example depicted in FIG. 5, the minor axes 11 of the magnetic arrays 1a and 1b are non-orthogonal to the plane of the substrate 3. Generally the major axis of symmetry 12 between targets 2a and 2b is the same axis of symmetry as for arrays 1a and 1b, although not necessarily.

Figure 9:
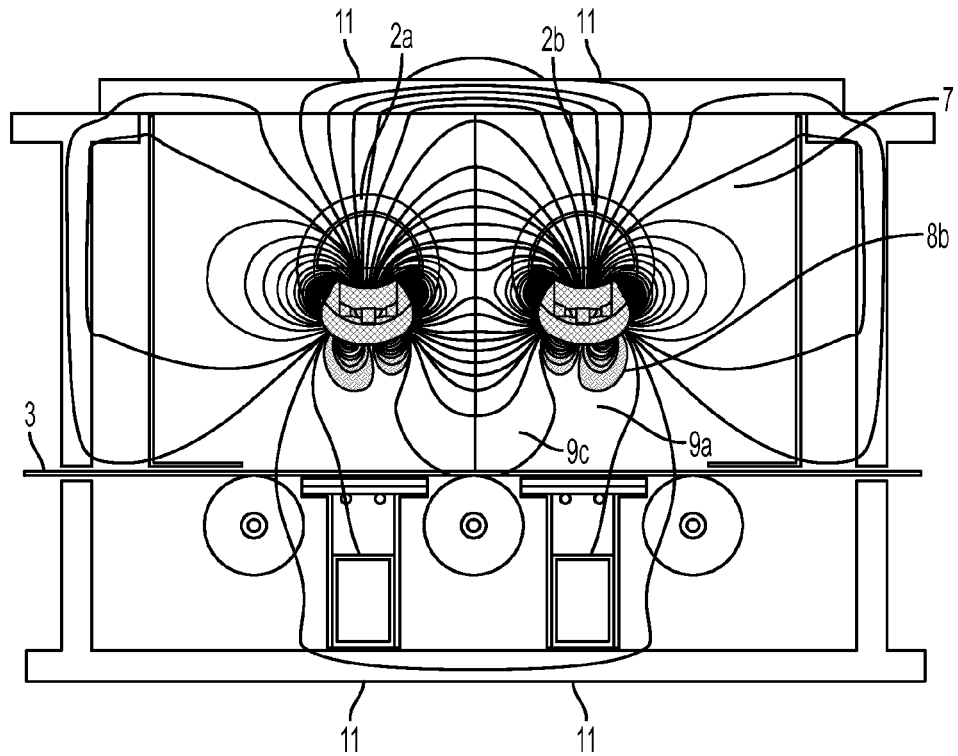
FIG. 9 is a cross-section of the magnetic field second variant of the asymmetric dual cylindrical magnetron of FIG. 5.

In FIG. 9, the minor axes 11 of asymmetric magnetic arrays of the illustrated example form a right angle with the substrate 3. Magnetic field lines 103 define the plasma zones. Typically, the cylindrical magnetrons are placed in a low pressure atmosphere 7. The main plasma zones 8b near each target 2a and 2b responsible for the sputtering effect are not symmetric with respect to the minor axis 11 of each individual magnetron. Typically the substrate to be treated 3 travels continuously in an in-line process which enables it to be exposed to a plasma flux area 9a. Plasma in 9a interacts with substrate 3 providing a self-bias and degree of ion bombardment on substrate 3. The current in AC mode needs to travel from target 2a to target 2b and vice versa. The electrons in the present configuration would be guided by adjacent field lines in region 9c which is still a low impedance path. In contrast to the current state of the art, in the present design of this example, an anomalous plasma region of high impedance such as 9e of FIG. 2 does not exist.

Figure 10:
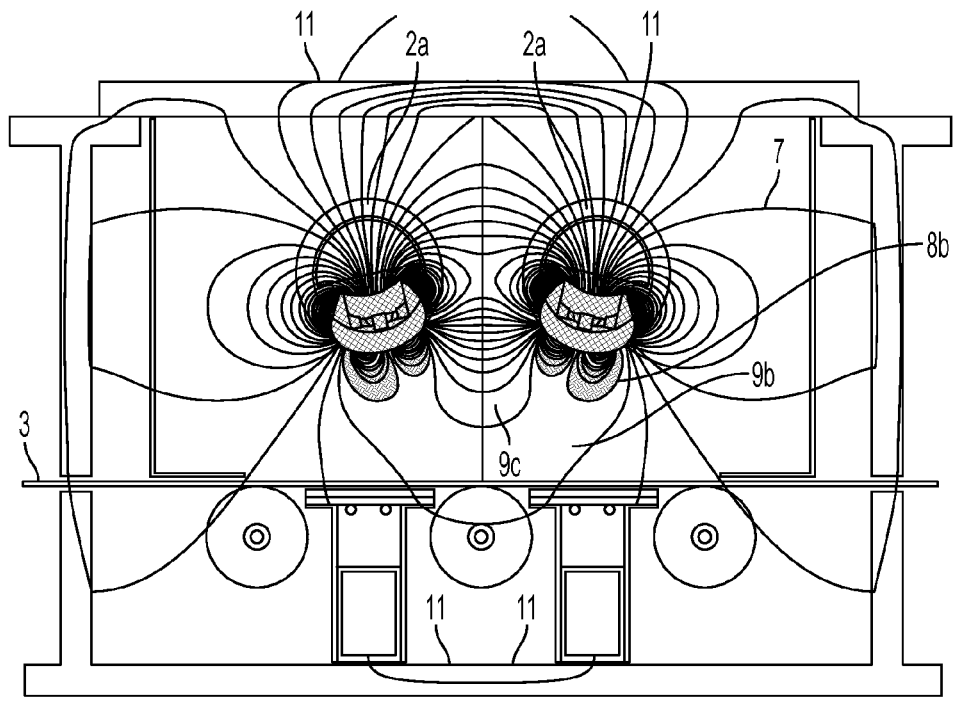
FIG. 10 is a cross-section of the magnetic field third variant of the asymmetric dual cylindrical magnetron of FIG. 5.

In FIG. 10, the minor axis 11 of asymmetric magnetic arrays of the present example forms a non-right angle to the substrate 3. Individual magnetic arrays in the present example are the same as those in FIG. 9, but are angled with respect to the substrate. Magnetic field lines 103 define the plasma zones 8, 9 in a similar manner. Typically, the cylindrical magnetrons are placed in a low pressure atmosphere 7. The main plasma zones 8b near each target 2a and 2b responsible for the sputtering effect are not symmetric with respect to the minor axis 11 of each individual magnetron. Typically, the substrate 3 to be treated travels continuously in an in-line process being which enables it to be exposed to a plasma flux area 9b. Plasma in the area 9b interacts with substrate 3 providing a self-bias and degree of ion bombardment on substrate 3. Variation in the angle between arrays provides a different degree of self-bias on substrate 3, and hence a different degree of ion bombardment.

In FIG. 9, plasma area 9b would be the main low impedance plasma channel for the AC current between targets 2a and 2b. A change in angle would provide optimisation of the ion bombardment during the deposition for different types of coatings or plasma treatment as different materials would require different degrees of bombardment. In the configuration depicted in FIG. 9, there is no anomalous plasma region of high impedance 9e, such as in the prior art example of FIG. 2.

Figure 11:
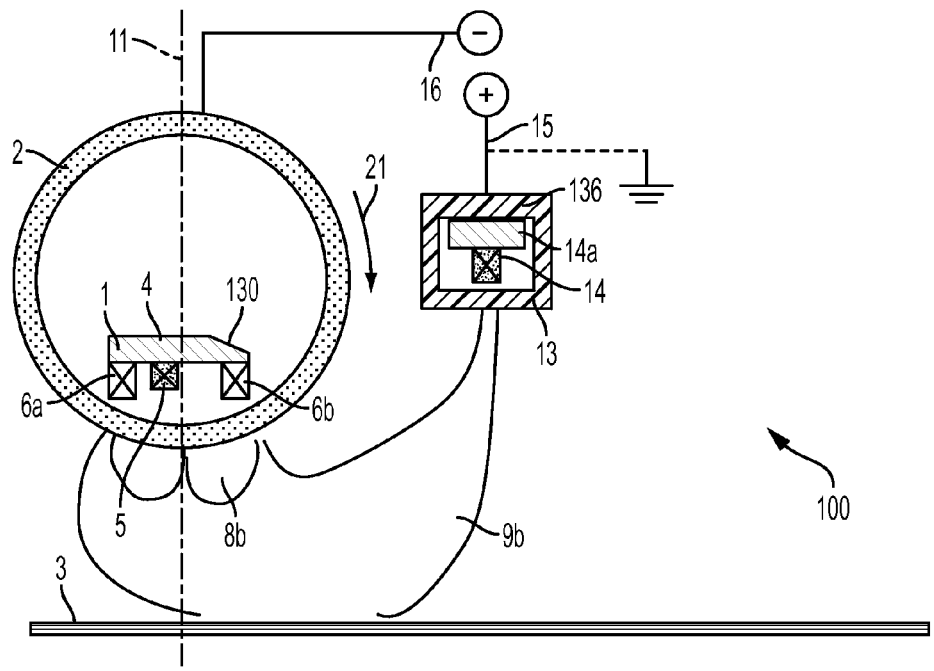
FIG. 11 is a schematic cross-section of a fourth variant of the asymmetric dual cylindrical magnetron of FIG. 5 comprising a single cathode instead of a dual cathode.

FIG. 11 shows an different configuration of a magnetron sputtering apparatus 100 according to the invention, which comprises a cylindrical magnetron located in a spaced-apart relationship to an auxiliary anode 13. The cylindrical magnetron and the auxiliary anode 13 are located above a substrate to be coated 3, which moves below the magnetron and impinges a plasma zone 9b.

The cylindrical magnetron comprises an magnetic array comprising a generally planar, ferromagnetic support plate 4. The magnetic array is rendered asymmetric by comprising one chamfered edge 130 and a central magnet row 5 that is offset with respect to the midline of the outer magnet rows 6a, 6b. The magnetic array sits inside, and is surrounded by a tubular target 2, which is arranged to rotate about its longitudinal axis as indicated by arrow 21.

The auxiliary anode 13 comprises a box-section metal tube 136 that is electrically connected to the positive terminal of a power supply 16 (or to earth) to attract electrons during the sputtering process. The metal tube 136 surrounds a generally planar, ferromagnetic mounting plate 4a to whose lower surface a magnet 14 is affixed, which deflects the magnetic field lines 103 to render the magnetic field, as a whole, asymmetric.

In FIG. 11, the system comprises an asymmetric magnetic array 1 which would enable sputtering of target 2 due to plasma trap region 8b. In the present invention target 2 is mainly acting as cathode and it is mainly negatively biased 16. It is not intended to sputter the auxiliary anode 13 of the present invention although in some instances that could also be desirable. Anode 13 is mainly positively biased 15 with respect to the target 2. Anode 13 could also be at ground potential. Region 9b guides the plasma electrons towards the anode 13. Guidance is enabled and/or enhanced by interaction of magnetic array 1 with magnetic means 14. Magnetic means 14 could be embedded within the anode 13 construction or could be in 2 complete separate areas. Magnetic means 14 could be a single or plurality of magnetic devices. Magnetic means 14 could be of a variable nature, in position, strength and orientation. Interactions between the different magnetic means would allow region 9b to define an appropriate interaction with substrate 3. Anode 13 could have different bias voltage along the length of cathode 2. Anode 13 could be a single one or a plurality of them. Anode 13 could be segmented so different areas could be biased differently, in which case tailored uniformity deposition and plasma density discharge along the cathode target 2 could be achieved.

Figure 12:
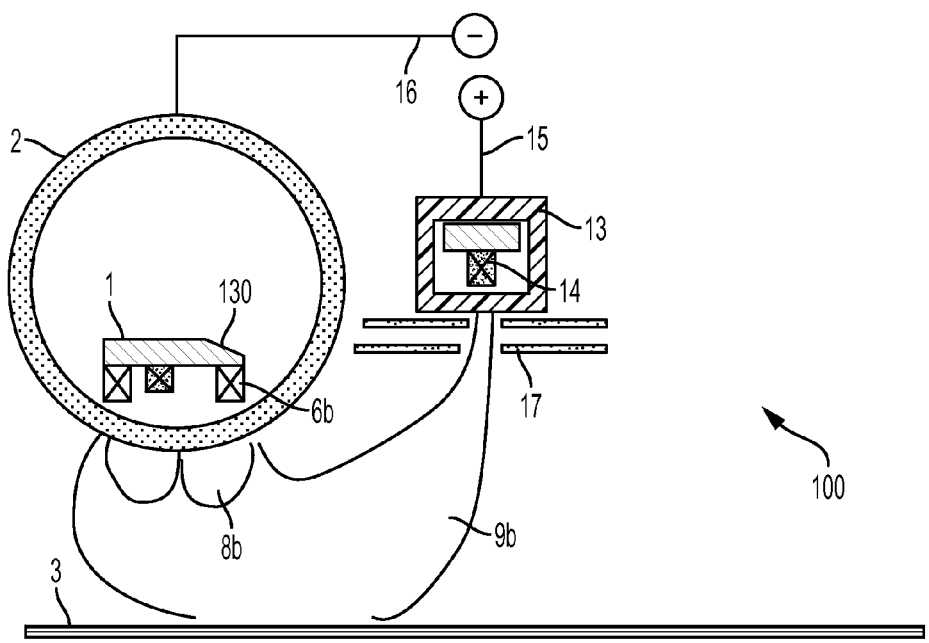
FIG. 12 is a schematic cross-section of a fifth variant of the asymmetric dual cylindrical magnetron of FIG. 5 comprising a single cathode instead of a dual cathode.

The embodiment of the invention depicted in FIG. 12 is similar to that depicted FIG. 11, except that in FIG. 12, elements 17 which constitute an anode cover are provided. The anode cover 17 effectively hides the anode 13 from deposition and/or contamination which could deteriorate the electrical properties of the anode 13. The system comprises of an asymmetric magnetic array 1 which would enable sputtering of target 2 due to plasma trap region 8b. In the present invention, target 2 is mainly acting as cathode and it is mainly negatively biased 16. It is not intended to sputter the auxiliary anode 13, although in some instances that could also be desirable. Anode 13 is mainly positively biased 15 with respect to the target 2, or could be at ground potential. Region 9b guides the plasma electrons towards the anode 13. Guidance is enabled and or enhanced by interaction of magnetic array 1 with magnetic means 14. Design of anode cover 17 would be such that the path for plasma electrons guided through zone 9b is not blocked; hence a low impedance path is still maintained. Ideally, the guidance magnetic means 14 could be embedded within the anode 13 construction or could be in 2 complete separate areas. Magnetic means 14 could be a single or plurality of magnetic devices. Magnetic means 14 could be of a variable nature, in position, strength and orientation. Interactions between the different magnetic means would allow region 9b to define an appropriate interaction with substrate 3. Anode cover 17 could also be biased at a different potential than cathode 2, anode 13 and ground. Anode cover 17 could be positively or negatively biased with respect to ground or could also be biased to the same ground potential. Anode cover 17 could be biased at different potentials in different segments along the length of the cathode 2 and anode 13. The bias voltage of anode cover 17 could be variable.

Figure 13:
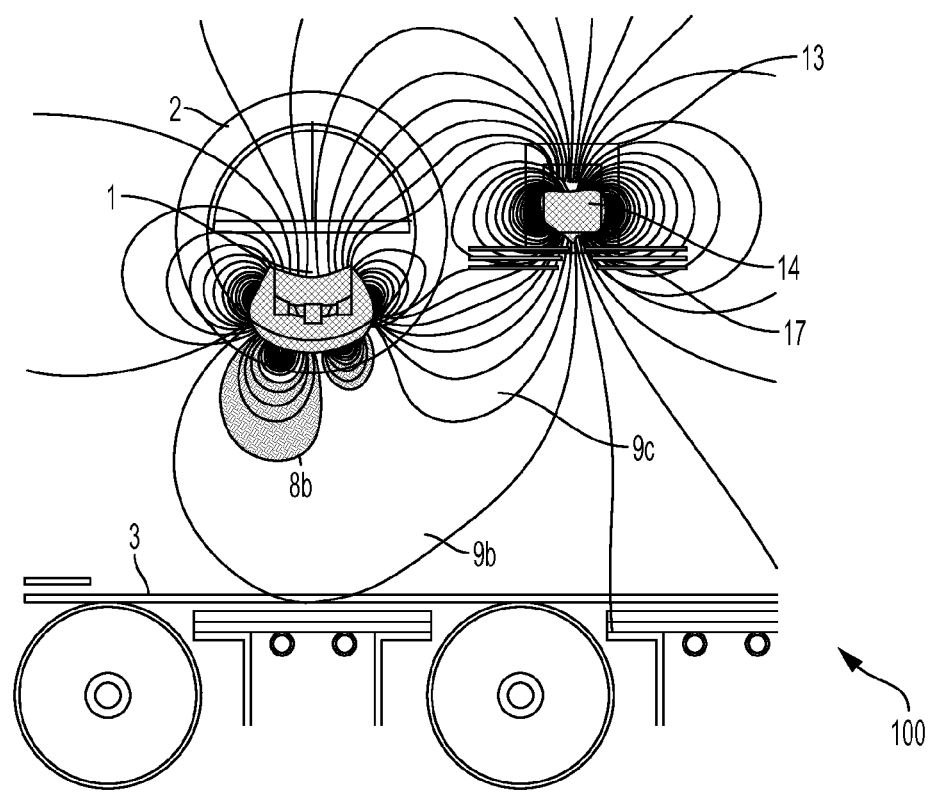
FIG. 13 is a schematic magnetic field line distribution diagram for an asymmetric single cylindrical cathode according to the invention with guided plasma to anode.

Finally, FIG. 13 shows the magnetic field lines 103 of the arrangement of FIG. 12 in greater detail. The system comprises an asymmetric magnetic array 1 which would enable sputtering of target 2 due to plasma trap region 8b. In the present invention target 2 is mainly acting as cathode and it is mainly negatively biased. It is not intended to sputter the auxiliary anode 13 of the present invention although in some instances that could also be desirable. Anode 13 is mainly positively biased with respect to the target 2, or could be at ground potential. Region 9b guides the plasma electrons towards the anode 13. Guidance is enabled and or enhanced by interaction of magnetic array 1 with magnetic means 14. Design of anode cover 17 would be such that path for plasma electrons guided through zone 9b is not blocked; hence a low impedance path is still maintained. Ideally the guidance magnetic means 14 could be embedded within the anode 13 construction or could be in 2 complete separate areas. Magnetic means 14 could be a single or plurality of magnetic devices. Magnetic means 14 could be of a variable nature, in position, strength and orientation. Interactions between the different magnetic means would allow region 9b to define an appropriate interaction with substrate 3. Anode cover 17 could be also biased at a different potential than cathode 2, anode 13 and ground. Anode cover 17 could be positively or negatively biased with respect to ground or could also be biased to same ground potential. Anode cover 17 could be biased at different potentials in different segments along the length of the cathode 2 and anode 13. The bias voltage of the anode cover 17 could be variable.

The invention claimed is:

1. A magnetron sputtering apparatus, comprising:
a first cylindrical target, the first target having a first longitudinal axis, the first target having a first minor axis of symmetry extending along a line intersecting and perpendicular to the first longitudinal axis;
a second target;
a first magnetic array, the first magnetic array being at least partially enclosed by the first target and configured to produce a first magnetic field, the first magnetic field defining a plurality of plasma zones, the plurality of plasma zones comprising:
a first main plasma zone for sputtering on a substrate, wherein the first main plasma zone is asymmetric with respect to the first minor axis of symmetry and is oriented toward the second target;
a first plasma flux zone through which the substrate is caused to pass;
a second magnetic array, the second magnetic array being configured to produce a second magnetic field, the second magnetic field defining a second plurality of plasma zones, the second plurality of plasma zones comprising:
a second main plasma zone for sputtering on the substrate oriented toward the first target; and
a second plasma flux zone through which the substrate is caused to pass, the second plasma flux zone communicating with the first plasma flux zone to form a low impedance path extending between the first target and second target for electron flow that contacts the substrate as the substrate is caused to pass the first plasma flux zone and the second plasma flux zone, wherein the low impedance path extends along a length of the first target and the second target, the length interposing a first end of the first target and the second target and a second end of the first target and the second target.

2. The apparatus of claim 1, the second target comprising:
a second cylindrical target, the second target having a second longitudinal axis, the second target having a second minor axis of symmetry extending along a line intersecting and perpendicular to the second longitudinal axis, the first target and the second target being arranged whereby the first longitudinal axis extends in a direction parallel to the second longitudinal axis; and wherein
the second magnetic array is at least partially enclosed by the second target and the second magnetic field defines a second plurality of plasma zones, the second plurality of plasma zones comprising:
a second main plasma zone for sputtering on the substrate, wherein the second main plasma zone is asymmetric with respect to the second minor axis of symmetry and is oriented toward the first target, the first magnetic array comprising a first magnet and a first mounting plate, and the second magnetic array comprising a second magnet and a second mounting plate, the asymmetry in at least one of the first main plasma zone and the second main plasma zone being caused by at least one of the location of the first magnet with respect to the first minor axis or the location of the second magnet with respect to the second minor axis, and a shape of the first mounting surface with respect to the first minor axis or a shape of the second mounting surface with respect to the second minor axis.

3. The apparatus of claim 1, the first magnetic array comprising a first plurality of magnets and a first mounting plate, the second magnetic array comprising a second plurality magnets and a second mounting plate, the asymmetry in at least one of the first main plasma zone and the second main plasma zone being caused by a ferromagnetic or non-ferromagnetic material that breaks a symmetry of interaction between two or more of the first plurality of magnets or the second plurality of magnets.

4. The apparatus of claim 2, the first main plasma zone and the second main plasma zone being symmetrical with respect to a major axis interposing the first target and the second target; the first target and the second target being rotatable, while maintaining the symmetry about the major axis.

5. The apparatus of claim 2, comprising:
a power means, the power means being connected to at least one of the first target and second target, the power means being configured to create and maintain a plasma comprising material removed from the target, the plasma being present in the first main plasma zone and the second main plasma zone.

6. The apparatus of claim 5, the power means being connected to both the first target and the second target.

7. The apparatus of claim 5 wherein the power means applies any one or more of the group comprising: an alternating current; a direct current; a pulsed current; a radio frequency; and a High Power Impulse Magnetron Sputtering (HIPIMS) to one or both targets.

8. The apparatus of claim 5, wherein the power means is connected to both targets and a polarity is alternated such that each target alternates between being an anode and a cathode.

9. The apparatus of claim 2, the first and second asymmetric magnetic arrays further comprising any one or more of the group comprising:

a central magnet and a pair of outer magnets located on opposite sides of, and spaced-apart from, the central magnet; and a central row of magnets and a pair of rows of magnets located on opposite sides of, and spaced apart from, the central magnet row; a mounting plate comprising a ferromagnetic material.

10. The apparatus of claim 1, the first magnetic field being a field distribution comprising one or more plasma traps adapted to confine a portion of plasma to the target.

11. The apparatus of claim 1, wherein the first target is a tubular target that is rotatable about the first longitudinal axis in any direction, continuously, intermittently or reversibly.

12. The apparatus of claim 1, wherein the first magnetic array is moveable in use.

13. The magnetron sputtering apparatus as claimed in claim 10, wherein the one or more plasma traps are arranged to sputter clean the surface of the first target, and the first target is continuously rotatable so that a sputter-cleaned portion of the first target is continuously moved into a vicinity of the low impedance path, or magnetic field channel, to provide an ideal conditioned anode/cathode surface.

14. The apparatus of claim 1, comprising:
a substrate and means for providing a controlled atmosphere in the vicinity of the first target and the substrate, the controlled atmosphere comprising any one or more of the group comprising: a partial vacuum; a total pressure of less than 1 mbar; an inert gas; argon; a reactive gas; hydrocarbon; organometallic; metal inorganic complex; oxygen; nitrogen; and water vapor.

15. The apparatus of claim 1, comprising:
an anode cover.

16. The apparatus of claim 2, wherein the first magnetic array and the second magnetic arrays are one of the group comprising: substantially the same and arranged asymmetrically about a major axis, the major axis interposing the first target and the second target; different and arranged symmetrically about the major axis; different and arranged asymmetrically about the major axis; and substantially the same and arranged symmetrically about the major axis.

17. The apparatus of claim 1, comprising:
a substrate and means for electrically biasing the substrate with respect to the target and ground, the means for electrically biasing applying any one or more of the group comprising: a direct current; an alternating current; a pulsed current; and a radio frequency bias, to the substrate.

18. The apparatus of claim 1, wherein the asymmetric axis of first magnetic array is non-orthogonal to a surface of the substrate.

19. The apparatus of claim 1, comprising part of a vacuum deposition system, a glass coating equipment system, or a web coating deposition system.

20. A magnetron sputtering process, comprising:
sputtering onto a substrate using the apparatus of claim 1, wherein the substrate is one of a plastic, a glass, a ceramic, a metal and a semiconductor.

21. The apparatus of claim 1, wherein the first target is a cathode and the second target is an anode.

22. The apparatus of claim 21, wherein electrons flow through the low impedance path from the cathode to the anode by contacting the substrate.

23. A magnetron sputtering apparatus, comprising:
a first cylindrical target, the first target having a first longitudinal axis, the first target having a first minor axis of symmetry extending along a line intersecting and perpendicular to the first longitudinal axis;

a second target;

a first magnetic array, the first magnetic array being at least partially enclosed by the first target and configured to produce a first magnetic field, the first magnetic field defining a plurality of plasma zones, the plurality of plasma zones comprising:

a first main plasma zone for sputtering on a substrate, wherein the first main plasma zone is asymmetric with respect to the first minor axis of symmetry and is oriented toward the second target;

a first plasma flux zone through which the substrate is caused to pass;

a second magnetic array, the second magnetic array being configured to produce a second magnetic field, the second magnetic field defining a second plurality of plasma zones, the second plurality of plasma zones comprising:

a second main plasma zone for sputtering on the substrate oriented toward the first target; and a second plasma flux zone through which the substrate is caused to pass, the second plasma flux zone communicating with the first plasma flux zone to form a low impedance path extending between the first target and second target for electron flow that contacts the substrate as the substrate is caused to pass the first plasma flux zone and the second plasma flux zone, wherein the low impedance path extends along an entire length of the first target and the second target.

* * * * *